US012706267B2

(12) United States Patent
Kinsel et al.

(10) Patent No.: US 12,706,267 B2
(45) Date of Patent: Aug. 11, 2026

(54) END OF LIFE MONITORING FOR A SOLID-STATE CIRCUIT BREAKER

(71) Applicant: Siemens Industry, Inc., Alpharetta, GA (US)

(72) Inventors: Hugh T. Kinsel, Sugar Hill, GA (US); Arthi Sudhakar Janakiraman, Cumming, GA (US); Scott Turner, Lilburn, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 321 days.

(21) Appl. No.: 18/455,310

(22) Filed: Aug. 24, 2023

(65) Prior Publication Data

US 2025/0069837 A1 Feb. 27, 2025

(51) Int. Cl.
*H01H 71/04* (2006.01)
*G01R 31/327* (2006.01)

(52) U.S. Cl.
CPC ......... *H01H 71/04* (2013.01); *G01R 31/3275* (2013.01); *H01H 2071/044* (2013.01)

(58) Field of Classification Search
None
See application file for complete search history.

(56) References Cited

U.S. PATENT DOCUMENTS 11,398,724 B1 * 7/2022 Yang ........................ H02H 3/08
2008/0180866 A1 * 7/2008 Wong .................. H02H 1/0015 361/45
2017/0184675 A1 * 6/2017 Freer ...................... H02H 3/044
2019/0103742 A1 * 4/2019 Kennedy ................ H01H 89/00
2020/0366078 A1 11/2020 Telefus et al.
2021/0226437 A1 * 7/2021 Lichauer ................ H02H 3/025
2021/0234358 A1 7/2021 Zhou et al.

FOREIGN PATENT DOCUMENTS

CA 3143655 A1 8/2022

OTHER PUBLICATIONS

Anonymous—Wikipedia Lineare: “Lineare Schadensakkumulation—Wikipedia”, May 26, 2021 (May 26, 2021), pp. 1-3, XP093227599, wikipedia.de Retrieved from the Internet: URL:https://de.wikipedia.org/wiki/Lineare_Schadensakkumulation.

* cited by examiner

*Primary Examiner* — Nasima Monsur

(57) ABSTRACT

A solid-state circuit breaker comprises an air gap, at least one counter and/or a timer, a memory, a radio and a microprocessor to: retrieve saved health data, alert data and counter, timer data from the memory, determine a status of a heath rating by data and comparing the heath rating to a threshold, if it is poor, send a message via a smart phone application (APP) and start a counter or timer, determine if the counter is at a predefined value and/or the timer is expired, if the counter is at a predefined value and/or the timer is expired, turn OFF the breaker and inhibit from being turned on, send a breaker OFF/disabled alert message using the radio to an end user/a customer via the APP, and if the counter is not at a predefined value and/or the timer is not expired, increment/decrement the counter and/or the timer.

16 Claims, 6 Drawing Sheets

300
Electrical Power In
Air Gap
103
101
105
Current Sensor
104C
TVS
104A
Electrical Power Out
103B
108
Q3
109
119
Temperature Sensor
117
116
118
Air Gap Sense
Load Current Sense
120
Temperature Sense
114
TRIP
107
106
Microprocessor
Radio (BT/Zigbee/WiFi)
+3.3V
113
Power Supply/ Driver
SS_SW_Ctrl
115
106A
112
R6
111
MOV
D1
110
Neutral
102

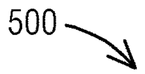

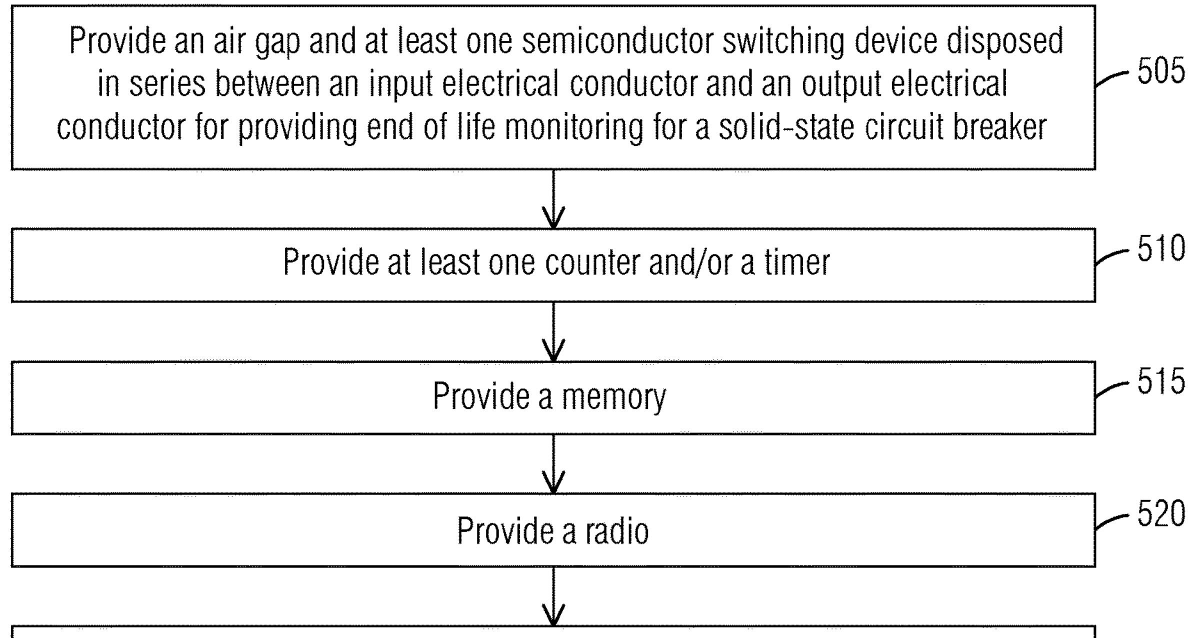

Provide a microprocessor that is configured to:

retrieve saved health data, alert data and the at least one counter and/or the timer data from the memory, determine a status of a health rating of the solid-state circuit breaker being based on the health data, the alert data, and the at least one counter and/or the timer data by comparing the health rating to a threshold, if the health rating determined to be poor, then send a poor health rating message using radio to an end user/a customer via a smart phone application (APP) and start a counter or timer, determine if the at least one counter is at a predefined value and/or timer is expired, if the at least one counter is at a predefined value and/or the timer is expired, turn OFF the solid-state circuit breaker and inhibit from being turned on, send a solid-state circuit breaker OFF/disabled alert message using the radio to an end user/a customer via a smart phone application (APP), if the at least one counter is not at a predefined value and/or the timer is not expired, increment and/or decrement the at least one counter and/or the timer

END OF LIFE MONITORING FOR A SOLID-STATE CIRCUIT BREAKER

BACKGROUND

1. Field

Aspects of the present invention generally relate to end-of-life monitoring for a solid-state circuit breaker to determine the health of the solid-state circuit breaker.

2. Description of the Related Art

Solid-state circuit breakers use power electronics as switching components instead of contacts as in traditional thermal-magnetic circuit breakers, and the switching process is arc free. Therefore, solid state circuit breakers show promising aspects for use in both AC and DC systems. Circuit breakers typically allow the flow of a load current a little over the rated current and follow a trip curve to identify unsafe current conditions before the breaker is tripped on overload. However, there is a certain window of load current between the rated current and safety threshold that the user can run current where tripping would not be initiated. Although this gives a buffer for the end user, it puts strain and increases wear on the electronic hardware inside the breaker, especially a solid-state circuit breaker where the load current passes through a solid-state (semiconductor) switching device. Over a period of time the breaker performance is degraded, becoming less efficient, generating more heat, and the breaker may trip at inopportune random times or no longer continue to function (power on) even though there are no safety concerns. Breaker contacts degrade over time based on arcing and electronic components degrade over time and temp. Contacts should not be subjected to arcing in a solid-state breaker.

Therefore, there is a need for an improved functionality for a solid-state circuit breaker.

SUMMARY

Briefly described, aspects of the present invention relate to a solid-state circuit breaker for end-of-life monitoring. The invention solves the problem by monitoring/logging at least one of the following items or parameters listed below to determine the health of the solid-state circuit breaker. This health rating would be available through a mobile App for the end user to view at any time. The breaker will send out alerts to the end user through the mobile App when the determined health rating has reached a predetermined value indicating poor health, warning the end user that the breaker is approaching its end of life and to replace the breaker at their earliest convenience.

Another feature of the invention is the solid-state circuit breaker disables itself from turning power on within a predetermined elapsed time after sending alerts to the end user, also alerting the user that the breaker will be disabled in predetermined elapsed time (for example, in 30 days).

In addition, the breaker sends out alerts repeatedly and periodically until the breaker is replaced. The invention monitors/logs at least one of the following items or parameters but not limited to:

Amount of time that breaker has been operating.

Amount of time that breaker has been conducting current over a predetermined amplitude.

Amount of time that breaker has been operating with an internal temperature over a predetermined temperature.

Number of overload trips (for example—135% to 800% of rated current overload)

Number of HIC trips (for example—>800% of rated current/short circuit current).

Number of mechanical operations of the air gap.

The health rating of the above items and parameters is based upon statistical test data and analysis such as the calculation of MTBF (mean time between failure) to predict an end of life of various components of the solid-state circuit breaker.

The health rating can be a hybrid of any combination of these above items.

A sample Health score:

| | | Health Rating | |
|---|---|---|---|
| A | Overloads | 5% | reduction per overload |
| B | HIC Faults | 10% | reduction per Fault |
| C | 85° C. Temp flag | 40% | reduction |
| D | Mechanical Ops | 0.03% | reduction per operation |
| E | Hours of Operation | 0.03% | reduction per 24 hrs |

$$\text{Health Rating}=100\%-(5*A+10*B+20*C+0.03*D+0.03*(E/24))$$

In accordance with one illustrative embodiment of the present invention, a solid-state circuit breaker is provided. It comprises an air gap and at least one semiconductor switching device disposed in series between an input electrical conductor and an output electrical conductor. It further comprises at least one counter and/or a timer, a memory, a radio and a microprocessor that is configured to:

- retrieve saved health data, alert data and the at least one counter and/or the timer data from the memory,
- determine a status of a heath rating of the solid-state circuit breaker being based on the health data, the alert data and the at least one counter and/or the timer data by comparing the heath rating to a threshold,
- if the health rating determined to be poor, send a poor health rating message using radio to an end user/a customer via a smart phone application (APP) and start a counter or timer,
- determine if the at least one counter is at a predefined value and/or the timer is expired, if the at least one counter is at a predefined value and/or the timer is expired,
- turn OFF the solid-state circuit breaker and inhibit from being turned on.
- send a solid-state circuit breaker OFF/disabled alert message using the radio to an end user/a customer via a smart phone application (APP), and
- if the at least one counter is not at a predefined value and/or the timer is not expired, increment and/or decrement the at least one counter and/or the timer.

In accordance with one illustrative embodiment of the present invention, a method of end-of-life monitoring for a solid-state circuit breaker is provided. The method comprises:

- providing an air gap and at least one semiconductor switching device disposed in series between an input electrical conductor and an output electrical conductor;
- providing at least one counter and/or a timer;
- providing a memory;

providing a radio; and providing a microprocessor that is configured to:

retrieve saved health data, alert data and the at least one counter and/or the timer data from the memory, determine a status of a heath rating of the solid-state circuit breaker being based on the health data, the alert data and the at least one counter and/or the timer data by comparing the heath rating to a threshold, if the health rating determined to be poor, send a poor health rating message using radio to an end user/a customer via a smart phone application (APP) and start a counter or timer, determine if the at least one counter is at a predefined value and/or the timer is expired, if the at least one counter is at a predefined value and/or the timer is expired, turn OFF the solid-state circuit breaker and inhibit from being turned on.

send a solid-state circuit breaker OFF/disabled alert message using the radio to an end user/a customer via a smart phone application (APP), and if the at least one counter is not at a predefined value and/or the timer is not expired, increment and/or decrement the at least one counter and/or the timer.

The above described features and advantages, as well as others, will become more readily apparent to those of ordinary skill in the art by reference to the following detailed description and accompanying drawings. While it would be desirable to provide one or more of these or other advantageous features, the teachings disclosed herein extend to those embodiments which fall within the scope of the appended claims, regardless of whether they accomplish one or more of the above-mentioned advantages.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects.

FIG. 2 is broken into two sub-figures namely FIG. 2A and FIG. 2B.

FIG. 5 illustrates a method for end-of-life monitoring of the solid-state circuit breaker in accordance with an exemplary embodiment of the present invention.

DETAILED DESCRIPTION

Figure 1:
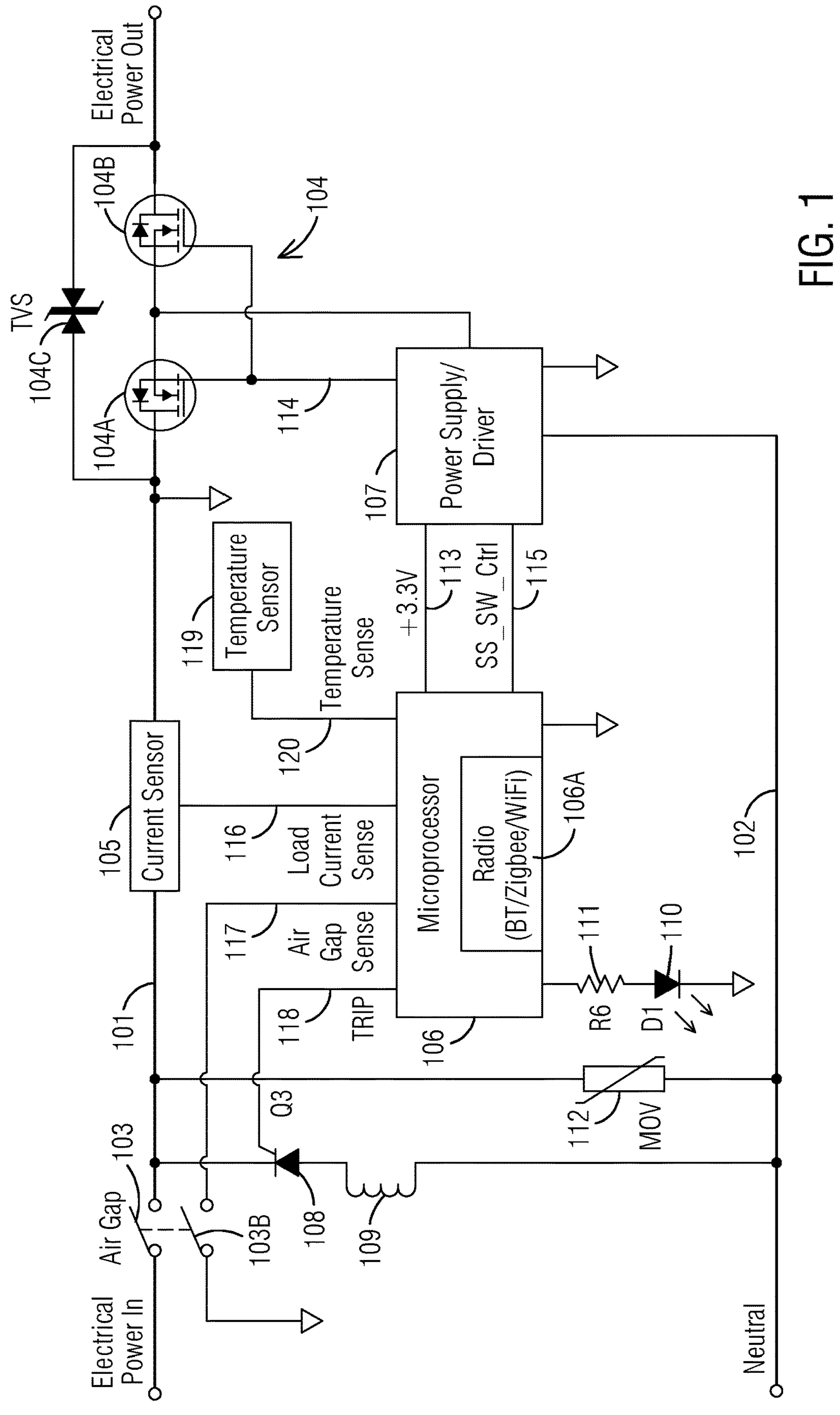
FIG. 1 illustrates a solid-state circuit breaker with electrical/electronic hardware in accordance with an exemplary embodiment of the present invention.

Various technologies that pertain to systems and methods that provide end-of-life monitoring of a solid-state circuit breaker will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

To facilitate an understanding of embodiments, principles, and features of the present invention, they are explained hereinafter with reference to implementation in illustrative embodiments. In particular, they are described in the context of a safe solid-state circuit breaker that includes an end-of-life monitoring feature. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of the solid-state circuit breaker according to the present disclosure are described below with reference to FIGS. 1-5 herein. Like reference numerals used in the drawings identify similar or identical elements throughout the several views. The drawings are not necessarily drawn to scale.

Currently, there is no health rating available in residential circuit breakers. The proposed method would warn the user that the breaker needs to be replaced soon due to wear. This provides a better user experience in that the user can replace the circuit breaker when it is convenient instead of having to replace the circuit breaker at an inopportune time because of frequent intermittent trips are such the circuit breaker no longer will power on. Providing a warning also alerts the customer that their breaker has been conducting more current than the rating. This lets the user evaluate their circuit and make changes to the circuit. This feature can be added with little or no cost added to the product. No additional electronic hardware is required. Only potential added cost would be if a larger memory size is required for the software code.

Consistent with one embodiment of the present invention, FIG. 1 represents a solid-state circuit breaker 100 in accordance with an exemplary embodiment of the present invention. The solid-state circuit breaker 100 provides an end-of-life monitoring feature.

The embodiment of the solid-state circuit breaker 100 consists of a conductor 101 capable of being electrically energized, a mechanism to open and close an air gap 103 and a pair of semi-conductor devices 104A and 104B that function as a "solid-state" switch 104 configured in series with conductor 101. The semi-conductor devices 104A and 104B are typically n-channel MOSFETs (metal-oxide-semiconductor field-effect transistor) often referred to as NMOS devices configured with their Source terminals coupled together. A TVS (Transient Voltage Suppressor) 104C is typically coupled across the Drain terminals to protect the solid-state switch 104 from high voltage transients that occur while switching power off from inductive loads on an electrical circuit. The solid-state circuit breaker 100 also consists of a power supply or AC to DC adaptor and driver 107, a microprocessor 106, a current sensor 105, a solenoid/electromagnet 109, a semi-conductor switch 108 used to energize the solenoid 109, and an electrical connection to a neutral or ground conductor 102. The solid-state circuit breaker 100 may also include a temperature sensor 119 typically located near the solid-state switch 104 (NMOS transistors 104A and 104B). The power supply or AC to DC adaptor and driver 107 is coupled between an electrical connection to a neutral or ground conductor 102 and the energized conductor 101. The power supply/driver 107 is electrically coupled by connections 113 to the microprocessor 106 which provides a means to energize the microprocessor 106. The power supply/driver 107 also provides a means for the microprocessor 106 to turn the solid-state switch 104 on and off by converting a signal 115 coupled from the microprocessor 106 to the power supply/driver 107 into a signal 114 of appropriate voltage levels that is coupled to the Gate terminals of the NMOS transistors 104A and 104B that turn the pair of NMOS transistors 104A and 104B on and off to function as the "solid-state" switch 104. The current sensor 105, which is typically a magnetic field sensing device or simply a shunt resistor, generates a signal 116 coupled to the microprocessor representative of the amplitude of the load current versus time. The microprocessor 106 is typically programmed to monitor the load current and respond to an overload current fault condition by turning off the solid-state switch 104 by generating a signal 115 coupled to the power supply/driver 107 which in turn generates the appropriate voltage signal 114 that is coupled to the Gate terminals of the NMOS transistors 104A and 104B to turn off the NMOS transistors 104A and 104B removing power from the load. This action of removing power from the load by shutting off the "solid-state" switch 104 (NMOS transistors 104A and 104B) requires only a few microseconds of time. However, UL489 requires that an air gap be established when a fault is detected, so the microprocessor 106 simultaneously generates a "trip" signal 118 coupled to the Gate terminals of the semi-conductor switch 108 which turns on and energizes the solenoid 109 by disposing it across an energized conductor 101 and a connection to neutral or ground conductor 102. The solenoid 109 generates a force coupled to a mechanism to open the air gap 103. This action of opening the air gap 103 usually requires a few milliseconds of time, thus the load current flowing through conductor 101 is already halted (amplitude is zero) and therefore eliminates arcing from occurring while opening the air gap 103. A second pole 103B of the air gap switch 103 is configured to generate a signal 117 that is coupled to the microprocessor 106 to alert the microprocessor 106 should an operator of this invention manually open the air gap 103. The microprocessor 106 immediately responds by asserting the signal 115 to the power supply/driver 107 to turn off the "solid-state" switch 104 (NMOS transistors 104A and 104B) in less than 50 microseconds prior to the air gap 103 forming which typically takes a few milliseconds. Turning off the "solid-state" switch 104 (NMOS transistors 104A and 104B) halts any current flowing in the conductor 101 and thus prevents arcing from occurring during the process of opening the air gap 103. Between initiating a trip signal to open the air gap 103, and monitoring a second pole 103B of the air gap 103, the microprocessor 106 can count the number of times the air gap 103 has been opened, and subsequently closed when the breaker 100 is powered back on. The solid-state breaker 100 consists of a radio 106A typically embedded into the microprocessor 106 which enables communication to an external device such as a user/customer's smart phone. The solid-state breaker 100 also may optionally consist of at least one temperature sensing device 119 strategically located near critical components in the solid-state breaker which has a signal 120 coupled to the microprocessor 106 representing the temperature. The solid-state breaker 100 may also consist of an LED 110 in which the microprocessor 106 can illuminate by asserting a signal through a resistor 111 to the LED 110. This provides visual communication method to the user/customer. The solid-state breaker 100 typically consists of a MOV 112 coupled from the hot conductor 101 to the connection to the neutral conductor 102 to protect electronic components from high voltage surges that occur on the electrical power. Multiple NMOS transistors can be connected in parallel to increase the current rating of the solid-state breaker 100, i.e., the "solid-state" switch 104 can safely pass larger amplitude current without damaging the NMOS transistors.

Figure 2A:
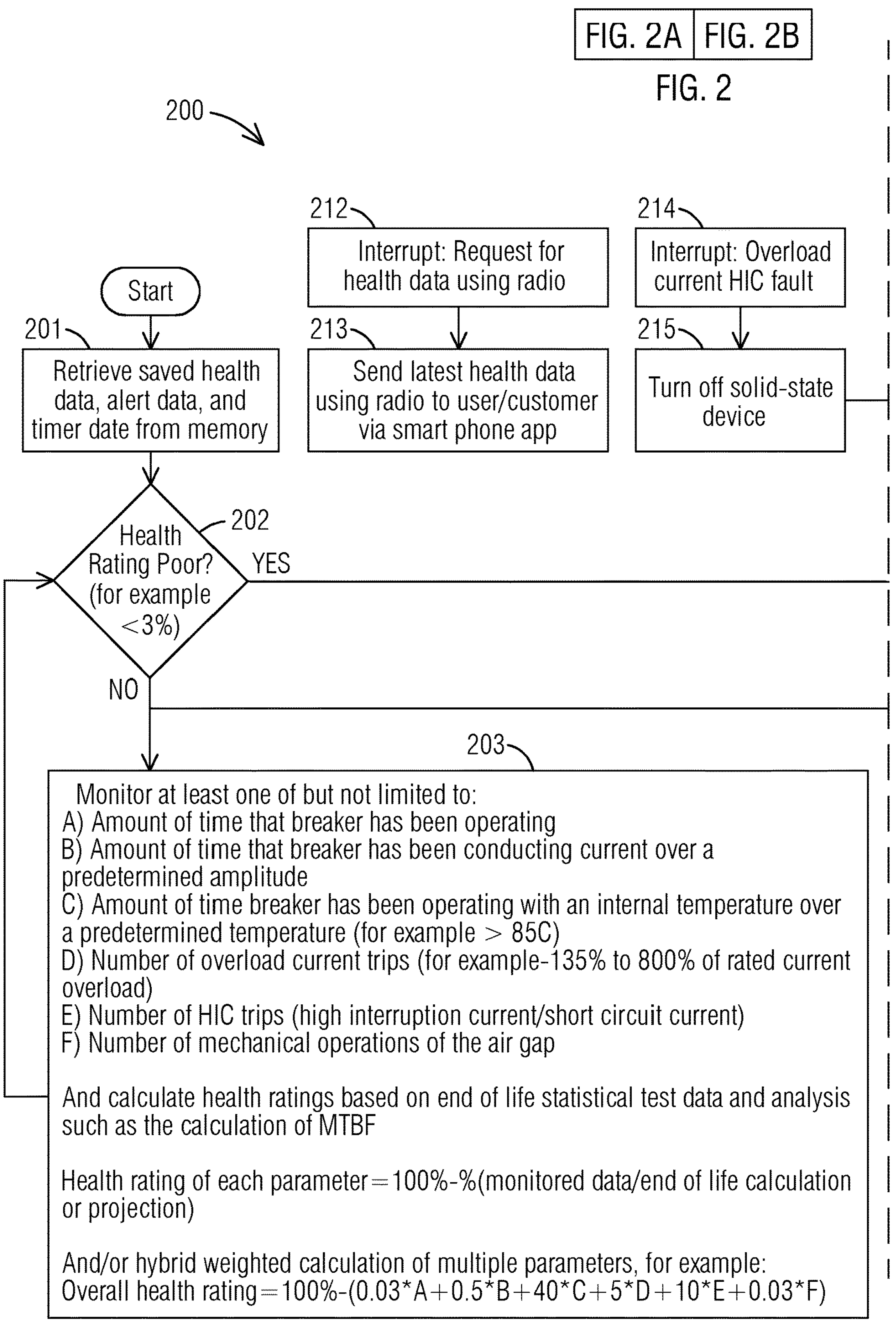
FIG. 2 (separated in FIG. 2A and FIG. 2B) illustrates a flow chart of end-of-life monitoring of the solid-state circuit breaker in accordance with an exemplary embodiment of the present invention.
Figure 2B:
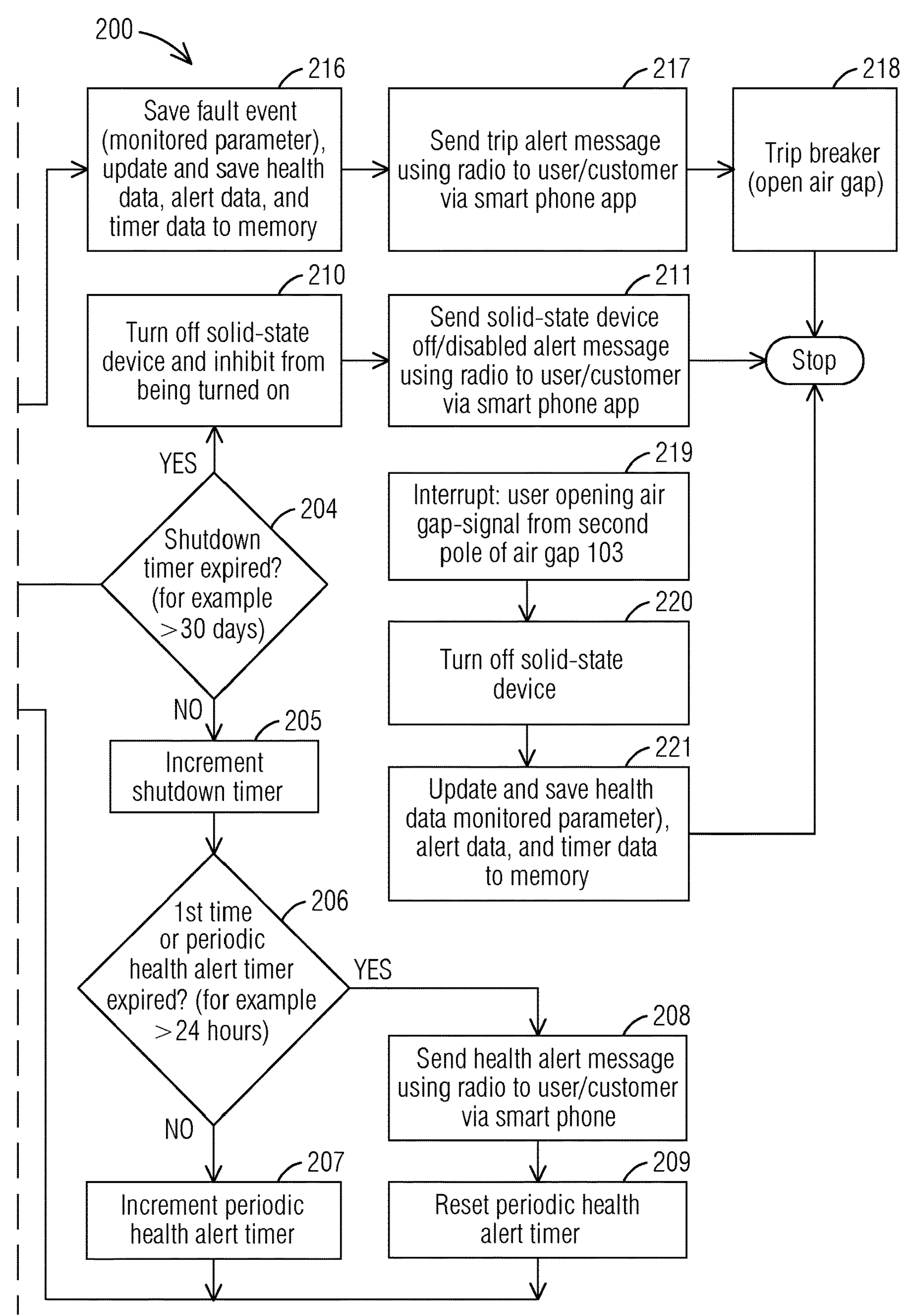

Referring now to FIG. 2 (separated in FIG. 2A and FIG. 2B), it illustrates a flow chart 200 of end-of-life monitoring of the solid-state circuit breaker 100 in accordance with an exemplary embodiment of the present invention. FIG. 2 is broken into two sub-figures namely FIG. 2A and FIG. 2B. The main concept of the invention is shown in FIG. 2. Upon powering on, the microprocessor 106 from FIG. 1 retrieves health data, alert data, and timer data from a memory in a step 201. After retrieving data from the memory, the microprocessor 106 then proceeds to continuously check the health rating in a step 202 and monitor at least one but not limited to the following parameters in a step 203:

A) Amount of time that breaker has been operating
B) Amount of time that breaker has been conducting current over a predetermined amplitude
C) Amount of time that breaker has been operating with an internal temperature over a predetermined temperature (for example >85 C)
D) Number of overload current trips (for example—135% to 800% of rated current overload)
E) Number of HIC trips (high interruption current/short circuit current)
F) Number of mechanical operations of the air gap The step 203 involves calculating and recalculating the health rating of each parameter and/or a hybrid weighted calculation of multiple parameters.

Health ratings of each parameter are based on end-of-life statistical test data and analysis such as the calculation of MTBF (mean time between failure). Health rating of each parameter can be calculated as 100%-% (monitored data divided by the end of life calculation or projection). An example of a hybrid calculation for an overall health rating can be calculated as 100%−(0.03*A+0.5*B+40*C+5*D+10*E+0.03*F)

If the health rating is poor, for example less than 3 percent, then a shutdown timer is checked in step 204 to see if 30 days has elapsed since the health rating was poor. If expired, the microprocessor 106 turns off solid-state device and inhibits solid-state device from ever turning back on again (see in a step 210), and sends solid-state device off/disabled alert message using radio to user/customer via smart phone app in a step 211. If not expired, the shutdown timer is incremented in a step 205. Next, if it is the first time the health rating was poor or if the periodic health alert timer has elapsed (>24 hours) since the last time a health alert message has been sent to the user (see a step 206), then the microprocessor 106 sends a health alert message using radio to user/customer via a smart phone in a step 208 and resets the periodic health alert timer in a step 209. Otherwise, the microprocessor 106 increments the periodic health alert timer in a step 207. The microprocessor 106 then returns to monitoring parameters and calculating health rating.

An interrupt in a step 212 may be received from the user using the radio requesting health data via a smart phone app. The microprocessor 106 responds by sending latest health data using radio to user/customer via the smart phone app in a step 213.

An interrupt may be generated in a step 214 by an independent process being executed by the microprocessor 106 that is monitoring load current for overload current and short circuit current (HIC) fault. The microprocessor 106 turns off the solid-state device in a step 215, saves the fault event data (part of monitored parameters including anticipated opening and subsequently closing the air gap), updates and saves the health data, alert data, and timer data to memory, sends trip alert message using radio to user/customer via the smart phone app in a step 217 before tripping the breaker (open the air gap) in a step 218.

An interrupt in a step 219 may be received from the second pole of the air gap 103 indicating the user is opening the air gap. The microprocessor 106 turns off the solid-state device in a step 220 and updates and saves health data (part of monitored parameter anticipated opening and subsequently closing the air gap), alert data, and timer data to the memory in a step 221.

Figure 3:
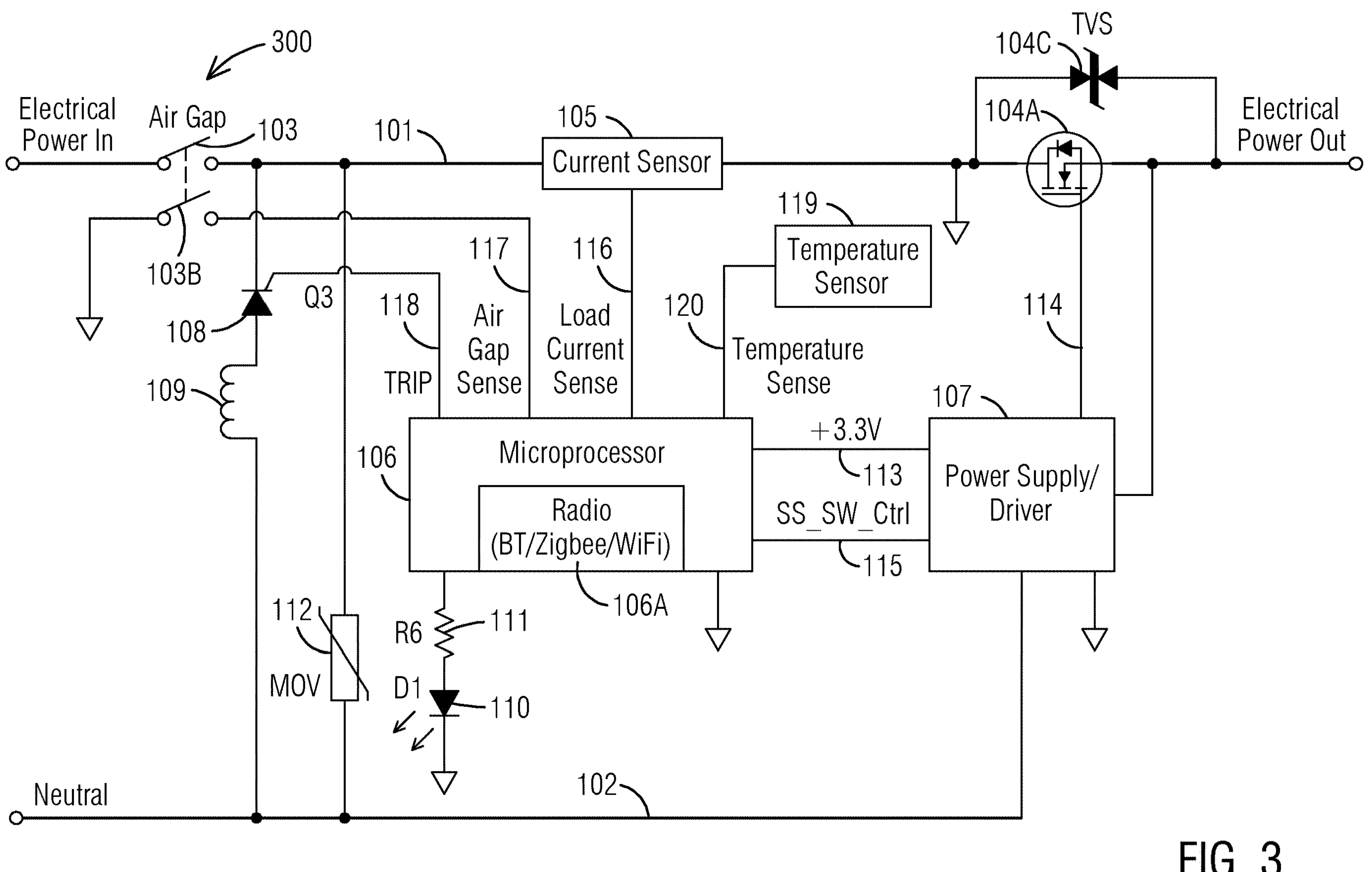
FIG. 3 illustrates a second solid-state circuit breaker with electrical/electronic hardware in accordance with an additional embodiment of the present invention.

Turning now to FIG. 3, it illustrates a second solid-state circuit breaker 300 with electrical/electronic hardware in accordance with an additional embodiment of the present invention. An alternate embodiment of the invention is shown in FIG. 3. It is similar to the embodiment 100 shown in FIG. 1 except NMOS transistor 104B is removed leaving a single semiconductor switching device, NMOS transistor 104A. However, a single MOSFET device (n-channel or p-channel) functions properly as a "solid-state" switch only for direct current (DC) electrical power systems. The MOSFET device has what's known as an intrinsic body diode from source to drain due to the construction method of a MOSFET device. Therefore, two MOSFET devices coupled by their source terminals in series is required to completely shut off power/current in alternating current (AC) electrical power systems.

Figure 4:
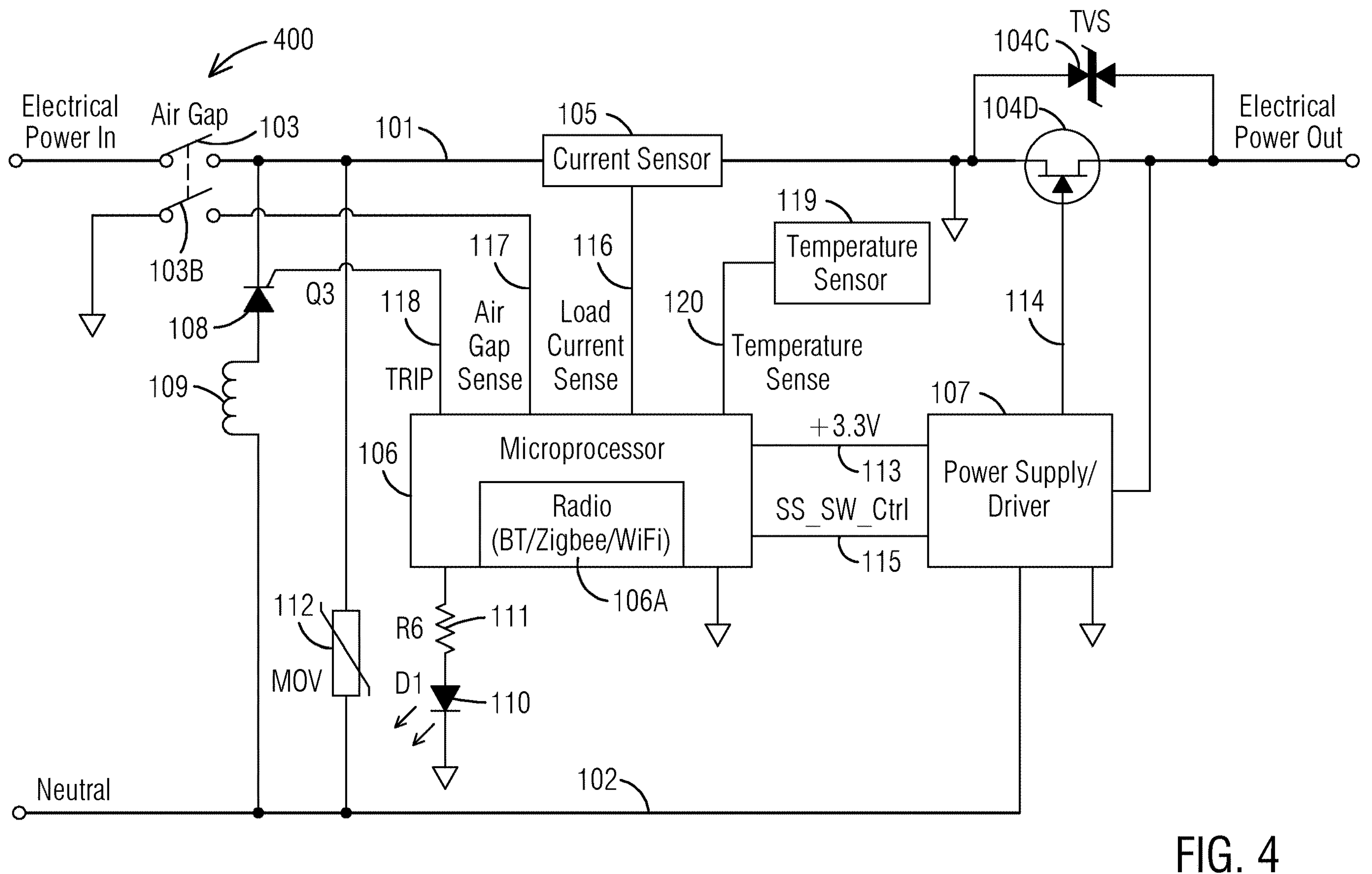
FIG. 4 illustrates a third solid-state circuit breaker with electrical/electronic hardware in accordance with an additional embodiment of the present invention.

FIG. 4 illustrates a third solid-state circuit breaker 400 with electrical/electronic hardware in accordance with an additional embodiment of the present invention. Another embodiment of the invention is shown in FIG. 4. It is similar to the embodiment shown in FIG. 3 except the single semiconductor switching device, NMOS transistor 104A, is replaced by a JFET (junction-gate field-effect transistor) 104D. The construction method of the JFET is different from a MOSFET and does not have an intrinsic body diode. Therefore, a single JFET can be used in DC or AC electrical power systems. However, a JFET is a depletion mode only device meaning it is normally on and turned off by modulating the gate terminal. The JFET requires a negative voltage relative to the source terminal to turn the device off making it more difficult to control as a power switching device in contrast to the MOSFET which exists as enhancement mode and depletion mode devices.

The enhancement mode MOSFET is normally off and is turned on by modulating the gate terminal. For the NMOS transistor, this is accomplished by applying a positive voltage to the gate terminal relative to the source terminal making it easier to control than the JFET device. Enhancement mode MOSFETs, the NMOS transistors 104A and 104B are depicted in the first embodiment in FIG. 1, and an enhancement mode MOSFET, the NMOS transistor 104A is depicted in the second embodiment in FIG. 3.

As seen in FIG. 5, it illustrates a method 500 for end-of-life monitoring of the solid-state circuit breaker 100 in accordance with an exemplary embodiment of the present invention. Reference is made to the elements and features described in FIGS. 1-4. It should be appreciated that some steps are not required to be performed in any particular order, and that some steps are optional.

The method 500 comprises a step 505 of providing an air gap and at least one semiconductor switching device disposed in series between an input electrical conductor and an output electrical conductor. The method 500 further comprises a step 510 of providing at least one counter and/or a timer. The method 500 further comprises a step 515 of providing a memory. The method 500 further comprises a step 520 of providing a radio. The method 500 further comprises a step 525 of providing a microprocessor that is configured to:

- retrieve saved health data, alert data and the at least one counter and/or the timer data from the memory,
- determine a status of a heath rating of the solid-state circuit breaker being based on the health data, the alert data and the at least one counter and/or the timer data by comparing the heath rating to a threshold,
- if the health rating determined to be poor, send a poor health rating message using radio to an end user/a customer via a smart phone application (APP) and start a counter or timer,
- determine if the at least one counter is at a predefined value and/or the timer is expired,
- if the at least one counter is at a predefined value and/or the timer is expired, turn OFF the solid-state circuit breaker and inhibit from being turned on.
- send a solid-state circuit breaker OFF/disabled alert message using the radio to an end user/a customer via a smart phone application (APP), and
- if the at least one counter is not at a predefined value and/or the timer is not expired, increment and/or decrement the at least one counter and/or the timer.

While a residential circuit breaker with a health rating based on a load current is described here a range of one or more other types of health ratings are also contemplated by the present invention. For example, other types of health ratings may be implemented based on one or more features presented above without deviating from the spirit of the present invention.

The techniques described herein can be particularly useful for a residential circuit breaker. While particular embodiments are described in terms of the residential circuit breaker, the techniques described herein are not limited to the residential circuit breaker but can also be used with other solid-state circuit breakers.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A solid-state circuit breaker comprising:

an air gap and a semiconductor switching device disposed in series between an input electrical conductor and an output electrical conductor;

a counter or a timer;

a memory;

a radio; and a microprocessor that is configured to:

retrieve health data and counter data or timer data from the memory, wherein the health data comprises data corresponding to monitored parameters associated with operational use of the solid-state circuit breaker, determine a status of a health rating of the solid-state circuit breaker being based on the health data, and the counter data or the timer data by comparing the health rating to a threshold, wherein the health rating is based on the following: amount of time of operation, amount of time of conducting current over a predetermined amplitude, amount of time of operating with a temperature over a predetermined value, number of overload trips, number of high interrupting capacity (HIC) trips, and number of mechanical operations of the air gap, in response to the status of the health rating being below a predetermined value, send a message indicating the health rating is below the predetermined value using the radio to an end user via a smart phone application (APP) and start the counter or timer to track a grace period, determine whether the counter has reached a predefined value or the timer has reached a predefined duration, in response to the counter having reached the predefined value or the timer having reached the predetermined duration, turn the solid-state circuit breaker off and inhibit from being turned on, send a solid-state circuit breaker OFF/disabled alert message using the radio to the end user via the smart phone application (APP), and in response to the counter not having reached the predefined value or the timer not having reached the predefined duration, increment or decrement the counter or the timer.

2. The solid-state circuit breaker of claim 1, further comprising:

a current sensor;

a temperature sensor;

a power supply/driver;

a Light Emitting Diode (LED); and an overvoltage protection device being a Metal Oxide Varistor (MOV) for protecting the microprocessor.

3. The solid-state circuit breaker of claim 1, wherein the solid-state circuit breaker OFF/disabled alert message alerts the end user that the solid-state circuit breaker's electronic performance has been affected by overuse.

4. The solid-state circuit breaker of claim 1, wherein the solid-state circuit breaker disables itself from turning power ON within a predetermined elapsed time after sending alerts to the end user, wherein the microprocessor is configured to alert the end user that the solid-state circuit breaker will be disabled in the predetermined elapsed time.

5. The solid-state circuit breaker of claim 1, wherein the solid-state circuit breaker sends out alerts repeatedly and periodically until the solid-state circuit breaker is replaced.

6. The solid-state circuit breaker of claim 1, wherein the solid-state circuit breaker, in response to a request for health data, sends latest health data using the radio to the end user via the smart phone application (APP).

7. The solid-state circuit breaker of claim 1, wherein the solid-state circuit breaker, in response to an interrupt of overload current, high interrupting capacity (HIC) fault, is configured to turn OFF the solid-state circuit breaker, save fault event (monitored parameter), update and save the health data, and the counter data or the timer data to the memory, send a trip alert message using the radio to the end user via the smart phone application (APP), and trip the solid-state circuit breaker (open airgap).

8. The solid-state circuit breaker of claim 1, wherein the solid-state circuit breaker, in response to an interrupt of the end user opening the air gap, is configured to turn OFF the solid-state circuit breaker and update and save the health data (monitored parameter), and the timer data to the memory.

9. A method of end-of-life monitoring for a solid-state circuit breaker, the method comprising:

providing an air gap and a semiconductor switching device disposed in series between an input electrical conductor and an output electrical conductor;

through operation of a microprocessor:

retrieving health data and counter data or timer data from a memory, wherein the health data comprises data corresponding to monitored parameters associated with operational use of the solid-state circuit breaker, determining a status of a health rating of the solid-state circuit breaker being based on the health data, and the counter data or the timer data by comparing the health rating to a threshold, wherein the health rating is based on the following: amount of time of operation, amount of time of conducting current over a predetermined amplitude, amount of time of operating with a temperature over a predetermined value, number of overload trips, number of high interrupting capacity (HIC) trips, and number of mechanical operations of the air gap, in response to the status of the health rating being below a predetermined value, sending a message indicating the health rating is below the predetermined value using a radio to an end user via a smart phone application (APP) and start the counter or timer to track a grace period, determining whether the counter has reached a predefined value or the timer has reached a predetermined duration, in response to the counter having reached the predefined value or the timer having reached the predetermined duration, turning the solid-state circuit breaker off and inhibiting from being turned on, sending a solid-state circuit breaker OFF/disabled alert message using the radio to the end user via the smart phone application (APP), and in response to the counter not having reached the predefined value or the timer not having reached the predetermined duration, incrementing or decrementing the counter or the timer.

10. The method of claim 9, wherein the solid-state circuit breaker further comprises:

a current sensor;

a temperature sensor;

a power supply/driver;

a Light Emitting Diode (LED); and an overvoltage protection device being a Metal Oxide Varistor (MOV) for protecting the microprocessor.

11. The method of claim 9, wherein the solid-state circuit breaker OFF/disabled alert message alerts the end user that the solid-state circuit breaker's electronic performance has been affected by overuse.

12. The method of claim 9, wherein the solid-state circuit breaker disables itself from turning power ON within a predetermined elapsed time after sending alerts to the end user, wherein the microprocessor alerts the end user that the solid-state circuit breaker will be disabled in the predetermined elapsed time.

13. The method of claim 9, wherein the solid-state circuit breaker sends out alerts repeatedly and periodically until the solid-state circuit breaker is replaced.

14. The method of claim 9, wherein the solid-state circuit breaker, in response to a request for health data, sends latest health data using the radio to the end user via the smart phone application (APP).

15. The method of claim 9, wherein the solid-state circuit breaker, in response to an interrupt of overload current, high interrupting capacity (HIC) fault, is configured to turn OFF the solid-state circuit breaker, save fault event (monitored parameter), update and save the health data, and the counter data or the timer data to the memory, send a trip alert message using the radio to the end user via the smart phone application (APP), and trip the solid-state circuit breaker (open airgap).

16. The method of claim 9, wherein the solid-state circuit breaker, in response to an interrupt of the end user opening the air gap, is configured to turn OFF the solid-state circuit breaker and update and save the health data (monitored parameter), and the timer data to the memory.

* * * * *